(12) United States Patent
Oh et al.

(10) Patent No.: US 10,234,931 B2
(45) Date of Patent: Mar. 19, 2019

(54) ELECTRONIC DEVICE

(71) Applicant: EMPIRE TECHNOLOGY DEVELOPMENT LLC, Wilmington, DE (US)

(72) Inventors: Hyun Oh Oh, Gwacheon-si (KR); Jin Sam Kwak, Uiwang-si (KR); Ju Hyung Son, Uiwang-si (KR)

(73) Assignee: Empire Technology Development LLC, Wilmington, DE (US)

( * ) Notice: Subject to any disclaimer, the term of this patent is extended or adjusted under 35 U.S.C. 154(b) by 98 days.

(21) Appl. No.: 15/308,611

(22) PCT Filed: May 5, 2014

(86) PCT No.: PCT/US2014/036721
§ 371 (c)(1),
(2) Date: Nov. 3, 2016

(87) PCT Pub. No.: WO2015/171101
PCT Pub. Date: Nov. 12, 2015

(65) Prior Publication Data
US 2017/0185137 A1    Jun. 29, 2017

(51) Int. Cl.
*G06F 1/32* (2006.01)
*G11C 5/14* (2006.01)
(Continued)

(52) U.S. Cl.
CPC .......... *G06F 1/3287* (2013.01); *G06F 1/3275* (2013.01); *G11C 5/141* (2013.01); *G11C 14/00* (2013.01); *G11C 14/0009* (2013.01); *H02J 7/0068* (2013.01); *G11C 11/4074* (2013.01); *G11C 2207/2227* (2013.01); *H02J 7/345* (2013.01)

(58) Field of Classification Search
None
See application file for complete search history.

(56) References Cited

U.S. PATENT DOCUMENTS 5,363,333 A    11/1994  Tsujimoto
6,105,138 A *   8/2000  Arakawa .................. G06F 1/263
                                                            307/31
(Continued)

OTHER PUBLICATIONS

William Enck et al., "Securing Non-Volatile Main Memory", Technical Report NAS-TR-0029-2006, Network and Security Research Center, 2006, pp. 1-20.
(Continued)

*Primary Examiner* — Jaweed A Abbaszadeh
*Assistant Examiner* — Cheri L Harrington

(57) ABSTRACT

Technologies are generally described for selectively charging a capacitor coupled to a memory. Example electronic devices described herein may include a memory; a capacitor coupled to the memory; a power supply configured to supply power at least to the capacitor; a switch coupled between the power supply and the capacitor; and a switch controller coupled to the switch and configured to: determine whether the electronic device is in a safety mode or in a normal mode, and control an operation of the switch, based on the determination. So, the supply of the power from the power supply to the capacitor is selectively controlled.

19 Claims, 8 Drawing Sheets

(51) Int. Cl.
  *G11C 14/00* (2006.01)
  *H02J 7/00* (2006.01)
  *G11C 11/4074* (2006.01)
  *H02J 7/34* (2006.01)
  *G06F 1/3287* (2019.01)
  *G06F 1/3234* (2019.01)

(56) References Cited

U.S. PATENT DOCUMENTS

| | | | |
|---|---|---|---|
| 6,496,939 B2* | 12/2002 | Portman | G06F 1/30 |
| | | | 713/330 |
| 7,107,480 B1* | 9/2006 | Moshayedi | G06F 11/1441 |
| | | | 714/2 |
| 7,634,688 B2* | 12/2009 | Madter | G06F 12/0804 |
| | | | 714/24 |
| 8,200,885 B2 | 6/2012 | Sartore | |
| 8,301,833 B1 | 10/2012 | Chen et al. | |
| 2006/0087882 A1* | 4/2006 | Kinsley | G11C 7/1045 |
| | | | 365/185.04 |
| 2010/0146333 A1* | 6/2010 | Yong | G06F 1/305 |
| | | | 714/14 |
| 2010/0277205 A1 | 11/2010 | Roth et al. | |
| 2014/0104963 A1* | 4/2014 | Andre | G11C 5/145 |
| | | | 365/189.09 |
| 2015/0319141 A1* | 11/2015 | Jang | H04W 4/21 |
| | | | 726/26 |
| 2017/0124792 A1* | 5/2017 | Schoenfelder | G07C 9/00571 |

OTHER PUBLICATIONS

International Search Report and Written Opinion of the International Searching Authority, International application No. PCT/US2014/036721, dated Sep. 25, 2014.

Wing-Kei Yu et al., "A Non-Volatile Microcontroller with Integrated Floating-Gate Transistors", IEEE/IFIP 41st International Conference on Dependable Systems and Networks Workshops (DSN-W), Jun. 27-30, 2011, pp. 1-32.

* cited by examiner

ELECTRONIC DEVICE

CROSS-REFERENCE TO RELATED APPLICATION

The present application is a U.S. National Stage filing under 35 U.S.C. § 371 of International Application No. PCT/US2014/036721, filed May 5, 2014 and entitled "ELECTRONIC DEVICE." The International Application, including any appendices or attachments thereof, is incorporated by reference herein in its entirety.

BACKGROUND

Unless otherwise indicated herein, the approaches described in this section are not prior art to the claims in this application and are not admitted to be prior art by inclusion in this section.

Electronic devices may use one or more of several different kinds of memory elements. One such memory element may be dynamic random-access memory (DRAM), which may offer a feature of great speed but at the cost of frequent refreshing. Also, DRAM may be volatile, that is, it may lose any data when power is removed. Various kinds of non-volatile memory have been developed to avoid the disadvantages of DRAM. For example, the non-volatile memory may include phase-change memory (PCM), magnetoresistive RAM (MRAM), spin-transfer torque RAM (STT-RAM), flash memory, and other memory cells that may retain stored data when power is removed. Several kinds of non-volatile memory may be implemented either as single-level cells (SLC) which may store a single bit or multi-level cells (MLC) which may store more than one bit. Each of these various kinds of volatile memory and non-volatile memory may have strengths and weaknesses, and no one memory device may provide an ideal solution for all applications.

SUMMARY

Technologies are generally described to provide an electronic device with control over power supplied to memories that store data.

Various example electronic devices described herein may include a memory; a capacitor coupled to the memory; a power supply configured to supply power at least to the capacitor; a switch coupled between the power supply and the capacitor; and a switch controller coupled to the switch and configured to: determine whether the electronic device is in a safety mode or in a normal mode, and control an operation of the switch, based on the determination, so as to control supply of the power from the power supply to the capacitor.

In some examples, a method performed under control of an electronic device including a memory, a capacitor coupled to the memory, a power supply configured to supply power at least to the capacitor, and a switch coupled between the power supply and the capacitor are described. An example method may include determining, by a switch controller coupled to the switch, whether the electronic device is in a safety mode or in a normal mode; and controlling, by the switch controller, an operation of the switch, based on the determining, so as to control the supply of the power from the power supply to the capacitor.

In some examples, a computer-readable storage medium is described that may be adapted to store a program executable by an electronic device including a memory, a capacitor coupled to the memory, a power supply configured to supply power at least to the capacitor, and a switch coupled between the power supply and the capacitor. The processor may include various features as further described herein. The program may include one or more instructions to determine, by a switch controller coupled to the switch, whether the electronic device is in a safety mode or in a normal mode. The program may further include one or more instructions to control, by the switch controller, an operation of the switch, based on the determination, so as to control the supply of the power from the power supply to the capacitor.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
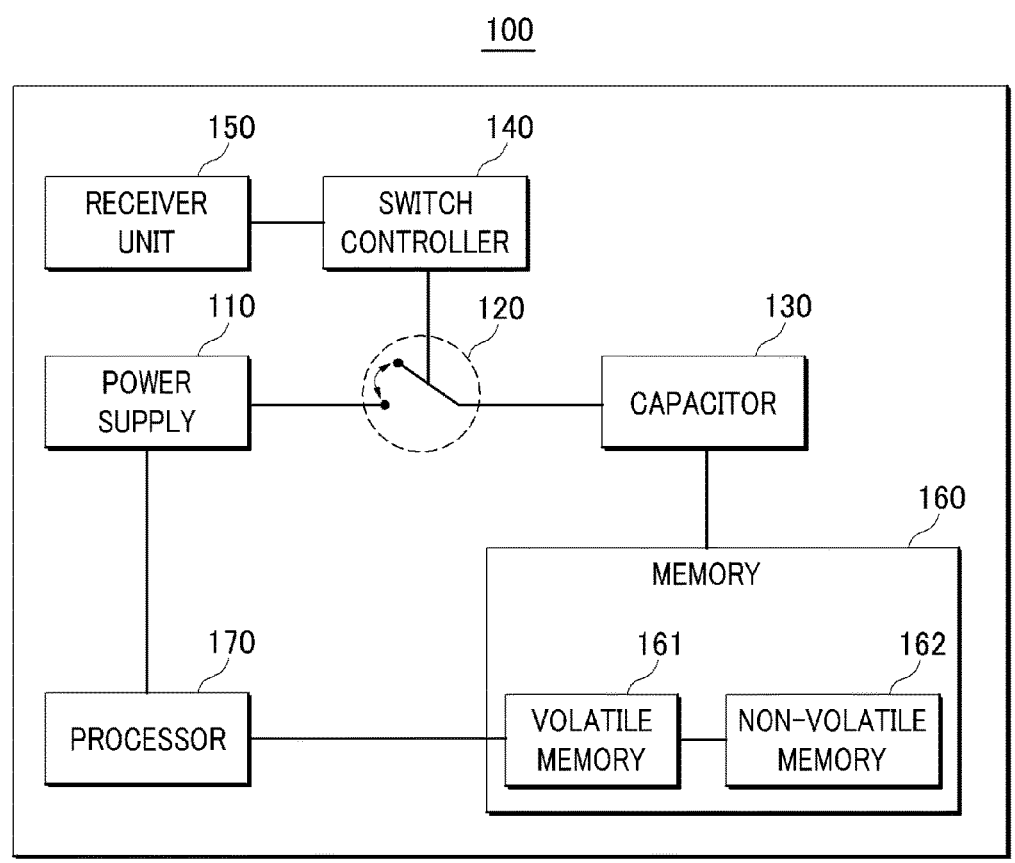
FIG. 1 shows a block diagram of an illustrative example electronic device that may include a memory.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to methods, apparatus, systems, devices and computer program products related to selectively charging a capacitor coupled to a memory included in an electronic device.

Briefly stated, technologies are generally described for determining whether an electronic device is in a normal mode or a safety mode, controlling a switch installed between a power supply that may supply power and a capacitor that may transmit charged power to a memory, based on the determination, and selectively charging the capacitor with the supplied power, based on the controlling of the switch.

FIG. 1 shows a block diagram of an illustrative example electronic device that may include a memory, arranged in accordance with at least some embodiments described herein. As depicted in FIG. 1, an electronic device 100 may include a power supply 110, a switch 120, a capacitor 130, a switch controller 140, a receiver unit 150, a memory 160, and a processor 170 operatively coupled to each other. Further, memory 160 may include a volatile memory 161 and a non-volatile memory 162. Although illustrated as discrete components, various components may be divided into additional components, combined into fewer components, supplemented with other components, or eliminated altogether while being contemplated within the scope of the disclosed subject matter. At least some function and/or operation of the components may be implemented, individually and/or collectively, by a wide range of hardware, software, firmware, or virtually any combination thereof.

In some embodiments, power supply 110 may be configured to supply power to operate electronic device 100. For example, power supply 110 may refer to a battery. Power supply 110 may be configured to supply the power to at least capacitor 130, switch controller 140, receiver unit 150, memory 160, and processor 170 included in electronic device 100. Further, the power supplied from power supply 110 may be charged (or accumulated) in capacitor 130, when electronic device 100 operates in a normal mode. A normal mode may include, for example, a mode in which at least processor 170 and volatile memory 161 are working with the power supplied from power supply 110.

Switch 120 may be configured to selectively couple power supply 110 with capacitor 130, based on an operating state of electronic device 100. Switch 120 may be in an on-state in which switch 120 may couple power supply 110 with capacitor 130, when electronic device 100 is in the normal mode. Further, switch 120 may be in an off-state in which capacitor 130 is decoupled from power supply 110, when electronic device 100 is in a safety mode. A safety mode may include, for example, a mode in which private data and/or sensitive data are inserted and/or stored in volatile memory 161.

Capacitor 130 may be coupled to power supply 110 via switch 120, when electronic device 100 is in the normal mode. So, capacitor 130 may be charged with the power supplied from power supply 110. Further, capacitor 130 may be coupled to at least one of memory 160 that may include volatile memory 161 and non-volatile memory 162 or processor 170. Capacitor 130 may be configured to transmit the charged power to at least one of memory 160 or processor 170, after power supply 110 stops the supply of the power (or power supply 110 reduces the power) in the normal mode. Thus, a power source to supply power to memory 160 and processor 170 may be altered from power supply 110 to capacitor 130.

Meanwhile, capacitor 130 may be decoupled from power supply 110, when electronic device 100 is in the safety mode and when switch 120 is turned off. So, supply of the power from/by power supply 110 to capacitor 130 may stop and capacitor 130 may not be charged. Thus, capacitor 130 may be selectively charged based on turn on/off of switch 120. Further, it is possible to reduce energy (or power) consumption and save power, since capacitor 130 is not charged in the safety mode. Further, since there is no accumulated power in capacitor 130 in the safety mode, capacitor 130 cannot transmit any power to at least one of memory 160 or processor 170, if power supply 110 stops the supply of the power (or power supply 110 reduces the power). So, data backup or data transmission from volatile memory 161 to non-volatile memory 162 may not occur, when power supply 110 stops the supply of the power in the safety mode.

Switch controller 140 may be coupled to switch 120 and receiver unit 150. Switch controller 140 may be configured to determine whether electronic device 100 is in the safety mode or in the normal mode. In some embodiments, switch controller 140 may be configured to determine that electronic device 100 is in the safety mode, based on a request for the safety mode, which is received from receiver unit 150. For example, operation of electronic device 100 in the safety mode may be requested by a user of electronic device 100.

Further, switch controller 140 may be configured to control operation of switch 120, based on the determination. Switch controller 140 may be configured to turn off switch 120, when electronic device 100 is determined to be in the safety mode. So, power supply 110 may be decoupled from capacitor 130 so that the power is not supplied to capacitor 130 by power supply 110. Further, switch controller 140 may be configured to turn on switch 120, when electronic device 100 is determined to be in the normal mode. So, power supply 110 may be coupled to capacitor 130 so that capacitor 130 may be charged with the power supplied from power supply 110. Thus, the supply of the power from power supply 110 to capacitor 130 and charging of capacitor 130 may be controlled, based upon switch controller 140 controlling the operation of switch 120.

Receiver unit 150 may be configured to receive a request for the safety mode or a request to change an operation mode of electronic device 100 from the normal mode to the safety mode. For example, when private information or sensitive data is stored in memory 160 (e.g., volatile memory 161), a user of electronic device 100 may make a user input to request for the safety mode.

Further, receiver unit 150 may be coupled to switch controller 140. Further, receiver unit 150 may be configured to transmit, to switch controller 140, the received request for the safety mode.

Memory 160 may include volatile memory 161 and non-volatile memory 162. Volatile memory 161 may refer to a memory that may require power to maintain the stored information. Volatile memory 161 may retain information stored therein while powered, but when power is interrupted, the stored information may be lost. For example, volatile memory 161 may include at least one of a dynamic random access memory (DRAM) or a static random access memory (SRAM). Further, non-volatile memory 162 may refer to a memory that may maintain information stored therein even when unpowered. For example, non-volatile memory 162 may include at least one of flash memory which may be based on an electrically erasable programmable read-only memory (EEPROM) technology, such as NAND flash memory or NOR flash memory, phase change memory (PCM), nitride read-only memory (NROM), ferroelectric random access memory (FRAM), or magnetoresistive RAM (MRAM).

When electronic device 100 operates in the normal mode, the power may be supplied to capacitor 130 and accumulated in capacitor 130. Further, if power supply 110 stops the supply of the power in the normal mode, the power that has been charged in capacitor 130 may be supplied to at least one of volatile memory 161 and processor 170. Further, data that is stored in volatile memory 161 may be transmitted to non-volatile memory 162 with the power supplied from capacitor 130. Thus, the data that has been stored in volatile memory 161 may be securely backed up to non-volatile memory 162, even when the power is abruptly cut off. In some embodiments, volatile memory 161 may be configured to transmit the data stored therein to non-volatile memory 162, automatically. Alternatively or additionally, volatile memory 161 may be configured to receive, from processor 170, an instruction to transmit the data, and to transmit the data, based on the instruction. Further, if the power supply 110 supplies the power again, the data stored in non-volatile memory 162 may be transmitted to volatile memory 161 again.

Meanwhile, when electronic device 100 operates in the safety mode, capacitor 130 may be decoupled from power supply 110, so capacitor 130 may not be charged. Accordingly, when power supply 110 stops the supply of the power in the safety mode, data transmission from volatile memory 161 to non-volatile memory 162 may not be performed, since the power may not be supplied to volatile memory 161 and processor 170 from any one of power supply 110 and capacitor 130.

Processor 170 may be configured to control data transmission from volatile memory 161 to non-volatile memory 162 while electronic device 100 is in the normal mode. When electronic device 100 has operated in the normal mode and the power from power supply 110 is abruptly cut off, processor 170 may be configured to receive (or be provided) power from capacitor 130 that has accumulated the power in the normal mode. Further, processor 170 may be configured to transmit, to volatile memory 161, an instruction to transmit data stored in volatile memory 161 to non-volatile memory 162. Meanwhile, when electronic device 100 has operated in the safety mode and the power from power supply 110 is abruptly cut off, no power may be supplied to processor 170. Thus, data backup from volatile memory 161 to non-volatile memory 162 may not occur.

Figure 2:
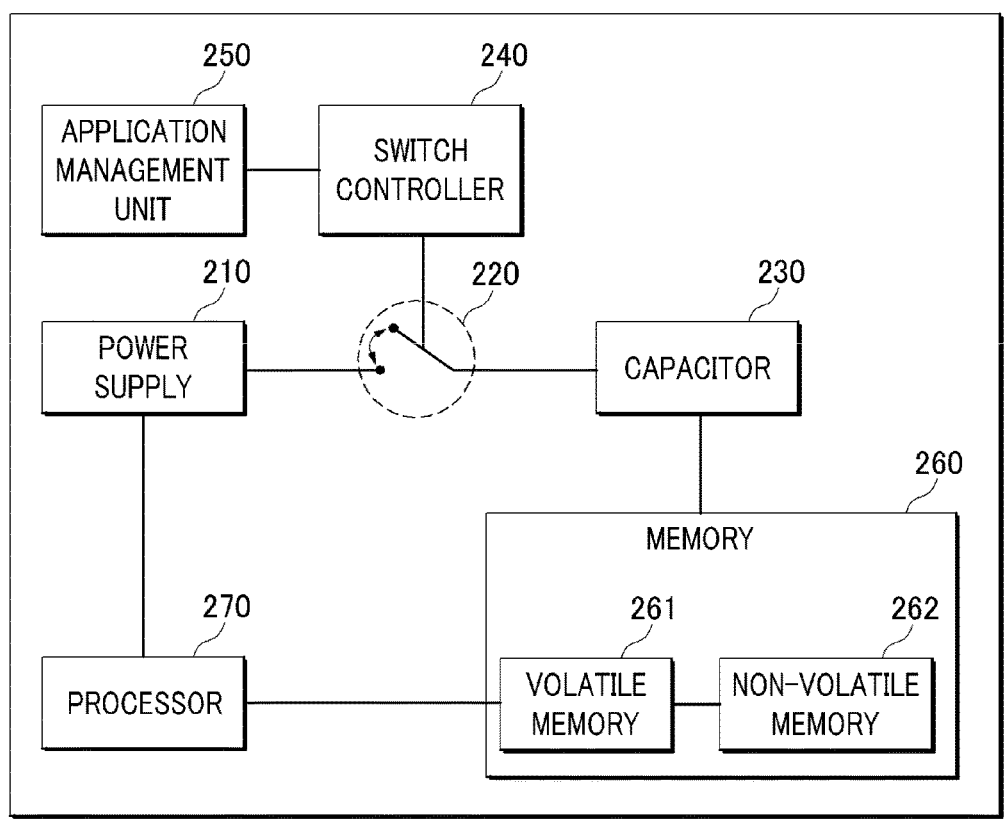
FIG. 2 shows a block diagram of another illustrative example electronic device that may include a memory.

FIG. 2 shows a block diagram of another illustrative example electronic device that may include a memory, arranged in accordance with at least some embodiments described herein. As depicted in FIG. 2, an electronic device 200 may include a power supply 210, a switch 220, a capacitor 230, a switch controller 240, an application management unit 250, a memory 260, and a processor 270 operatively coupled to each other. Further, memory 260 may include a volatile memory 261 and a non-volatile memory 262. Although illustrated as discrete components, various components may be divided into additional components, combined into fewer components, supplemented with other components, or eliminated altogether while being contemplated within the scope of the disclosed subject matter. At least some function and/or operation of the components may be implemented, individually and/or collectively, by a wide range of hardware, software, firmware, or virtually any combination thereof.

In some embodiments, power supply 210 may be configured to supply power to at least capacitor 230, switch controller 240, application management unit 250, memory 260, and processor 270.

Switch 220 may be configured to selectively couple power supply 210 with capacitor 230, based on an operation mode of electronic device 200. Switch 220 may couple power supply 210 with capacitor 230, when electronic device 200 is in the normal mode. Further, switch 220 may be decoupled from power supply 210, when electronic device 200 is in the safety mode.

Capacitor 230 may be coupled to power supply 210 via switch 220, when electronic device 200 is in the normal mode. So, capacitor 230 may be charged with the power supplied from power supply 210. Further, capacitor 230 may be coupled to at least one of memory 260 or processor 270. Capacitor 230 may be further configured to transmit the charged power to at least one of memory 260 or processor 270, after power supply 210 stops the supply of the power.

Meanwhile, capacitor 230 may be decoupled from power supply 210, when electronic device 200 is in the safety mode and when switch 220 is turned off. So, supply of the power from power supply 210 to capacitor 230 may stop and capacitor 230 may not be charged.

Switch controller 240 may be coupled to switch 220 and application management unit 250. Switch controller 240 may be configured to determine whether electronic device 200 is in the safety mode or in the normal mode. In some embodiments, switch controller 240 may be configured to determine that electronic device 200 is in the safety mode, based on at least one of a type, characteristics, or internal setting information of an application hosted (or executed) on electronic device 200. For example, when a banking application that may use private information for its operation is hosted (or executed) on electronic device 200, switch controller 240 may determine that electronic device 200 is in the safety mode.

Further, switch controller 240 may be configured to control operation of switch 220, based on the determination. Switch controller 240 may be configured to turn off switch 220, when electronic device 200 is determined to be in the safety mode. Further, switch controller 240 may be configured to turn on switch 220, when electronic device 200 is determined to be in the normal mode. Thus, capacitor 130 may be selectively charged with the power supplied from power supply 210.

Application managements unit 250 may be coupled to switch controller 240. Further, application managements unit 250 may be configured to host (or execute) various kinds of applications on electronic device 200.

Memory 260 may include volatile memory 261 and non-volatile memory 262. When electronic device 200 operates in the normal mode, the power may be supplied to capacitor 230 and accumulated in capacitor 230. Further, if power supply 210 stops the supply of the power in the normal mode, the power that has been charged in capacitor 230 may be supplied to at least one of volatile memory 261 and processor 270. So, data that has been stored in volatile memory 261 may be transmitted to non-volatile memory 262 with the power supplied from capacitor 230. Further, if the power supply 210 supplies the power again, the data stored in non-volatile memory 262 may be transmitted to volatile memory 261 again.

Meanwhile, when electronic device 200 operates in the safety mode, capacitor 230 may be decoupled from power supply 210, so capacitor 230 may not be charged. Accordingly, when power supply 210 stops the supply of the power in the safety mode, data transmission from volatile memory 261 to non-volatile memory 262 may not be performed, since power may not be supplied to volatile memory 261 and processor 270.

Processor 270 may be configured to control data transmission from volatile memory 261 to non-volatile memory 262 in the normal mode. When electronic device 200 has operated in the normal mode and when the power from power supply 210 is abruptly cut off, processor 270 may be configured to receive power from capacitor 230 that has been charged with the power in the normal mode. Further, processor 270 may be configured to transmit, to volatile memory 261, an instruction to transmit data stored in volatile memory 261 to non-volatile memory 262.

Figure 3:
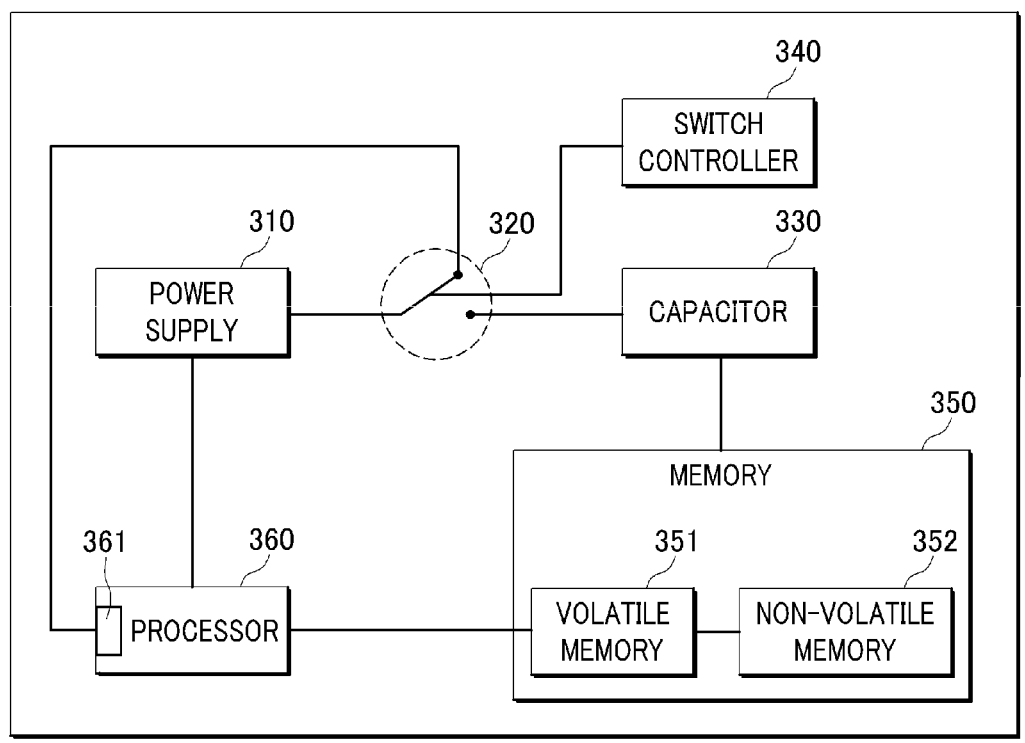
FIG. 3 shows a block diagram of still another illustrative example electronic device that may include a memory.

FIG. 3 shows a block diagram of still another illustrative example electronic device that may include a memory, arranged in accordance with at least some embodiments described herein. As depicted in FIG. 3, an electronic device 300 may include a power supply 310, a switch 320, a capacitor 330, a switch controller 340, a memory 350, and a processor 360 operatively coupled to each other. Further, memory 350 may include a volatile memory 351 and a non-volatile memory 352. Further, a pad 361 may be installed in processor 360. Although illustrated as discrete components, various components may be divided into additional components, combined into fewer components, supplemented with other components, or eliminated altogether while being contemplated within the scope of the disclosed subject matter. At least some function and/or operation of the components may be implemented, individually and/or collectively, by a wide range of hardware, software, firmware, or virtually any combination thereof.

In some embodiments, power supply 310 may be configured to supply power to at least capacitor 330, switch controller 340, memory 350, and processor 360.

Switch 320 may be configured to selectively couple power supply 310 with capacitor 330. Switch 320 may decouple capacitor 330 from power supply 310, if a secure enable pin is set in pad 361 that receives a signal indicating that electronic device 300 is in the safety mode.

Capacitor 330 may be decoupled from power supply 310, when electronic device 300 is in the safety mode and when switch 320 is turned off. So, supply of the power from power supply 310 to capacitor 330 may stop and capacitor 330 may not be charged.

Switch controller 340 may be coupled to switch 320. Switch controller 340 may be configured to determine that electronic device 300 is in the safety mode, when switch 320 is coupled to the secure enable pin that is set in pad 361 included in processor 360. Further, switch controller 340 may be configured to control operation of switch 320, based on the determination. Switch controller 340 may be configured to turn off switch 220, when electronic device 300 is determined to be in the safety mode.

Further, switch controller 340 may be configured to transmit, to processor 360, a signal that indicates that electronic device 300 is in the safety mode and switch 320 is turned off, via a signal line coupled to pad 361 (or the secure enable pin) in processor 360.

Memory 350 may include volatile memory 351 and non-volatile memory 352. When electronic device 300 operates in the safety mode, capacitor 330 may be decoupled from power supply 310, so capacitor 330 may not be charged. Accordingly, when power supply 310 stops the supply of the power, data transmission from volatile memory 351 to non-volatile memory 352 may not be executed, since the power may not be supplied to volatile memory 351 and processor 360.

Processor 360 may be configured to control data transmission from volatile memory 351 to non-volatile memory 352. Further, a signal line that may transmit a signal indicating that switch 320 is turned off may be hard-wired to processor 360. Further, the signal line may be coupled to a pin (e.g., the secure enable pin) which may be set in pad 361 included in processor 360. Thus, processor 360 may not transmit, to volatile memory 351, an instruction to transmit data stored in volatile memory 351 to non-volatile memory 352, when power supply 310 stops the supply of power. Further, in some embodiments, if switch 320 enters in an off-state in which capacitor 330 is decoupled from power supply 310, a signal or parameter that is coupled to the off-state may be transmitted to pad 361 included in processor 360 via the signal line. In response to the receipt of the signal or parameter, processor 360 may be configured to control an operating state of electronic device 300 to be in the safety mode.

Figure 4:
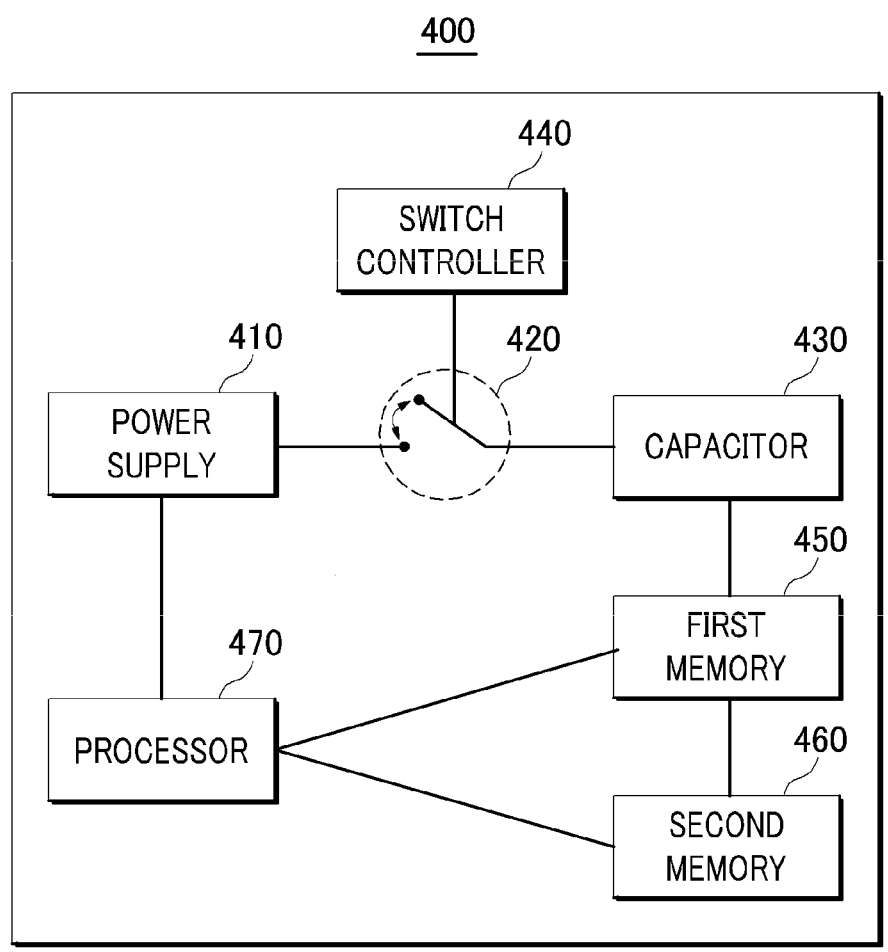
FIG. 4 shows a block diagram of still another illustrative example electronic device that may include a memory.

FIG. 4 shows a block diagram of still another illustrative example electronic device that may include a memory, arranged in accordance with at least some embodiments described herein. As depicted in FIG. 4, an electronic device 400 may include a power supply 410, a switch 420, a capacitor 430, a switch controller 440, a first memory 450, a second memory 460, and a processor 470 operatively coupled to each other. Although illustrated as discrete components, various components may be divided into additional components, combined into fewer components, supplemented with other components, or eliminated altogether while being contemplated within the scope of the disclosed subject matter. At least some function and/or operation of the components may be implemented, individually and/or collectively, by a wide range of hardware, software, firmware, or virtually any combination thereof.

In some embodiments, power supply 410 may be configured to supply power to at least capacitor 430, switch controller 440, first memory 450, second memory 460, and processor 470.

Switch 420 may be configured to selectively couple power supply 410 with capacitor 430. Switch 420 may couple power supply 410 and capacitor 430, when electronic device 400 is in the normal mode. Further, switch 420 may decouple capacitor 430 from power supply 410, when electronic device 400 is in the safety mode.

Capacitor 430 may be coupled to power supply 410 via switch 420, when electronic device 400 is in the normal mode. Further, capacitor 430 may be charged with the power supplied from power supply 410 up to a particular amount. The particular amount to which the power is charged in capacitor 430 may be predetermined and/or previously set in electronic device 400. In some embodiments, the particular amount may be adjustable, variable, random, etc. and need not necessarily be predetermined and/or previously set. Further, capacitor 430 may be coupled to at least one of first memory 450, second memory 460 or processor 470. Capacitor 430 may be configured to transmit the particular amount of the charged power to at least one of first memory 450, second memory 460 or processor 470, after power supply 410 stops the supply of the power. Further, capacitor 430 may be configured to determine an amount of the power to be transmitted to respective one of first memory 450 and second memory 460. For example, capacitor 430 may be configured to transmit, to first memory 450, a first part of the particular amount of power, and to transmit, to second memory 450, a second part of the particular amount of power, which is less than the first part. Further, capacitor 430 may be configured to selectively transmit the charged power to at least one memory from among multiple memories coupled to capacitor 430.

Meanwhile, capacitor 430 may be decoupled from power supply 410, when electronic device 400 is in the safety mode and when switch 420 is turned off. So, supply of the power from power supply 410 to capacitor 430 may stop and capacitor 430 may not be charged.

Switch controller 440 may be coupled to switch 420. Switch controller 440 may be configured to determine whether electronic device 400 is in the safety mode or in the normal mode. For example, switch controller 440 may determine that electronic device 400 is in the safety mode, based on a user request to change the operation mode of electronic device 400 into the safety mode or an application hosted (or executed) on electronic device 400. Further, switch controller 440 may be configured to control operation of switch 420, based on the determination. Switch controller 440 may be configured to turn off switch 420, when electronic device 400 is determined to be in the safety mode. Further, switch controller 440 may be configured to turn on switch 420, when electronic device 400 is determined to be in the normal mode. Thus, capacitor 430 may be selectively charged with the power supplied from power supply 410 according to the operation mode of electronic device 400.

Each of first memory 450 and second memory 460 may include a volatile memory and a non-volatile memory. When electronic device 400 operates in the normal mode, the power may be supplied to capacitor 430 and may be accumulated in capacitor 430. Further, if power supply 410 stops the supply of the power in the normal mode, the power that has been charged in capacitor 430 may be supplied to at least one volatile memory included in each of first memory 450 and second memory 460, and processor 270. So, data that is stored in the volatile memory may be transmitted to the non-volatile memory included in first memory 450 and second memory 460 with the power supplied from capacitor 430.

Meanwhile, when electronic device 400 operates in the safety mode, capacitor 430 may be decoupled from power supply 410, so capacitor 430 may not be charged. Accordingly, when power supply 410 stops the supply of the power in the safety mode, data transmission from the volatile memory to the non-volatile memory included in each of first memory 450 and second memory 460 may not be performed, since the power may not be supplied to the volatile memory and processor 470.

Processor 470 may be configured to control data transmission from the volatile memory to the non-volatile memory included in each of first memory 450 and second memory 460. When electronic device 400 has operated in the normal mode and the power from power supply 410 is abruptly cut off, processor 470 may be configured to receive power from capacitor 430 that has accumulated the power in the normal mode. Further, processor 470 may be configured to transmit, to the volatile memory included in each of first memory 450 and second memory 460, an instruction to transmit data stored in the volatile memory to the non-volatile memory included in each of first memory 450 and second memory 460.

Figure 5:
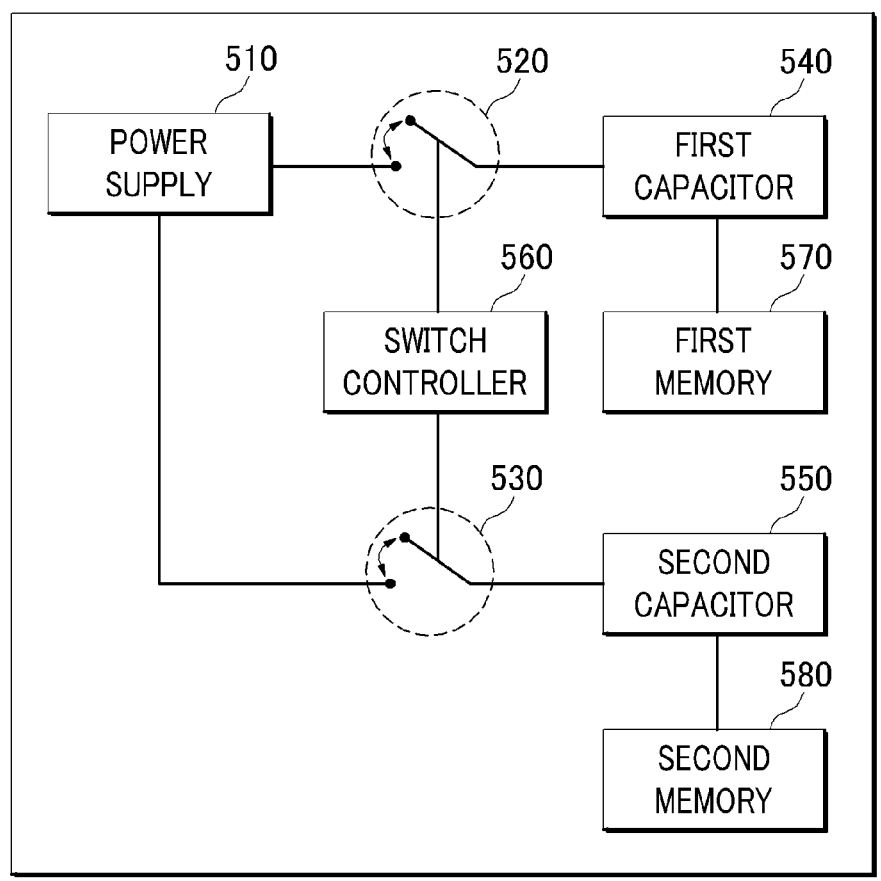
FIG. 5 shows a block diagram of still another illustrative example electronic device that may include a memory.

FIG. 5 shows a block diagram of still another illustrative example electronic device that may include a memory, arranged in accordance with at least some embodiments described herein. As depicted in FIG. 5, an electronic device 500 may include a power supply 510, a first switch 520, a second switch 530, a first capacitor 540, a second capacitor 550, a switch controller 560, a first memory 570, and a second memory 580 operatively coupled to each other. Although illustrated as discrete components, various components may be divided into additional components, combined into fewer components, supplemented with other components, or eliminated altogether while being contemplated within the scope of the disclosed subject matter. At least some function and/or operation of the components may be implemented, individually and/or collectively, by a wide range of hardware, software, firmware, or virtually any combination thereof. Further, although, in FIG. 5, electronic device 500 is illustrated to include no processor, a processor configured to control data transmission in first memory 570 and second memory 580 may be included in electronic device 500.

In some embodiments, power supply 510 may be configured to supply power to at least first capacitor 540, second capacitor 550, switch controller 560, first memory 570, and second memory 580.

First switch 520 may be configured to selectively couple power supply 510 with first capacitor 540 based on an operation mode of electronic device 500. First switch 520 may couple power supply 510 with first capacitor 540, when electronic device 500 is in the normal mode. Further, first switch 520 may decouple first capacitor 540 from power supply 510, when electronic device 500 is in the safety mode.

Second switch 530 may be configured to selectively couple power supply 510 with second capacitor 550 based on an operation mode of electronic device 500. Second switch 530 may connect power supply 510 and second capacitor 550, when electronic device 500 is in the normal mode. Further, second switch 530 may decouple second capacitor 550 from power supply 510, when electronic device 500 is in the safety mode. Thus, electronic device 500 may be configured to include a respective switch that corresponds to each capacitor and which may be configured to selectively couple power supply 510 with each of the capacitors.

First capacitor 540 may be coupled to power supply 510 via first switch 520, when electronic device 500 is in the normal mode. So, first capacitor 540 may be charged with the power supplied from power supply 510. Further, first capacitor 540 may be coupled to first memory 570. First capacitor 540 may be configured to transmit the charged power to first memory 570, after power supply 510 stops the supply of the power in the normal mode. Meanwhile, first capacitor 540 may be decoupled from power supply 510, when electronic device 500 is in the safety mode and when first switch 520 is turned off. So, supply of the power from power supply 510 to first capacitor 540 may stop and first capacitor 540 may not be charged.

Second capacitor 550 may be coupled to power supply 510 via second switch 530, when electronic device 500 is in the normal mode. So, second capacitor 550 may be charged with the power supplied from power supply 510. Further, second capacitor 550 may be coupled to second memory 580. Second capacitor 550 may be configured to transmit the charged power to second memory 580, after power supply 510 stops the supply of the power in the normal mode. Meanwhile, second capacitor 550 may be decoupled from power supply 510, when electronic device 500 is in the safety mode and when second switch 530 is turned off. So, supply of the power from power supply 510 to second capacitor 550 may stop and second capacitor 550 may not be charged.

Switch controller 560 may be coupled to first switch 520 and second switch 530. Switch controller 560 may be configured to determine whether electronic device 500 is in the safety mode or in the normal mode. For example, switch controller 560 may determine that electronic device 500 is in the safety mode, based on a user request for the safety mode or an application hosted on electronic device 500. Further, switch controller 560 may be configured to respectively control operations of first switch 520 and second switch 530, based on the determination. For example, switch controller 560 may be configured to turn off at least one of first switch 520 and second switch 530 selectively (e.g., turn off first switch 520 and turn on second switch 530), when electronic device 500 is determined to be in the safety mode. Further, switch controller 560 may be configured to turn on at least one of first switch 520 and second switch 530 selectively, when electronic device 500 is determined to be in the normal mode. Thus, switch controller 560 may be configured to selectively control the supply of the power from power supply 510 to respective one of first memory 570 and second memory 580.

Each of first memory 570 and second memory 580 may include a volatile memory and a non-volatile memory. When electronic device 500 operates in the normal mode, the power may be supplied to first capacitor 540 and second capacitor 550 and accumulated in first capacitor 540 and second capacitor 550. Further, if power supply 510 stops the supply of the power, the power that has been charged in first capacitor 540 and second capacitor 550 may be supplied to the volatile memory included in each of first memory 570 and second memory 580 that corresponds to each of first capacitor 540 and second capacitor 550. So, data that is stored in each volatile memory may be respectively transmitted to each non-volatile memory included in first memory 570 and second memory 580 with the power supplied from corresponding first capacitor 540 and second capacitor 550.

Meanwhile, when electronic device 500 operates in the safety mode, at least one of first capacitor 540 and second capacitor 550 may be selectively decoupled from power supply 510, so, at least one of first capacitor 540 and second capacitor 550 that is decoupled from power supply 550 may not be charged. Accordingly, when power supply 510 stops the supply of the power in the safety mode, data transmission from the volatile memory to the non-volatile memory included in first memory 570 and/or second memory 580 that corresponds to the decoupled first capacitor 540 and/or second capacitor 550 may not be performed, since the power may not be supplied to the volatile memory.

Figure 6:
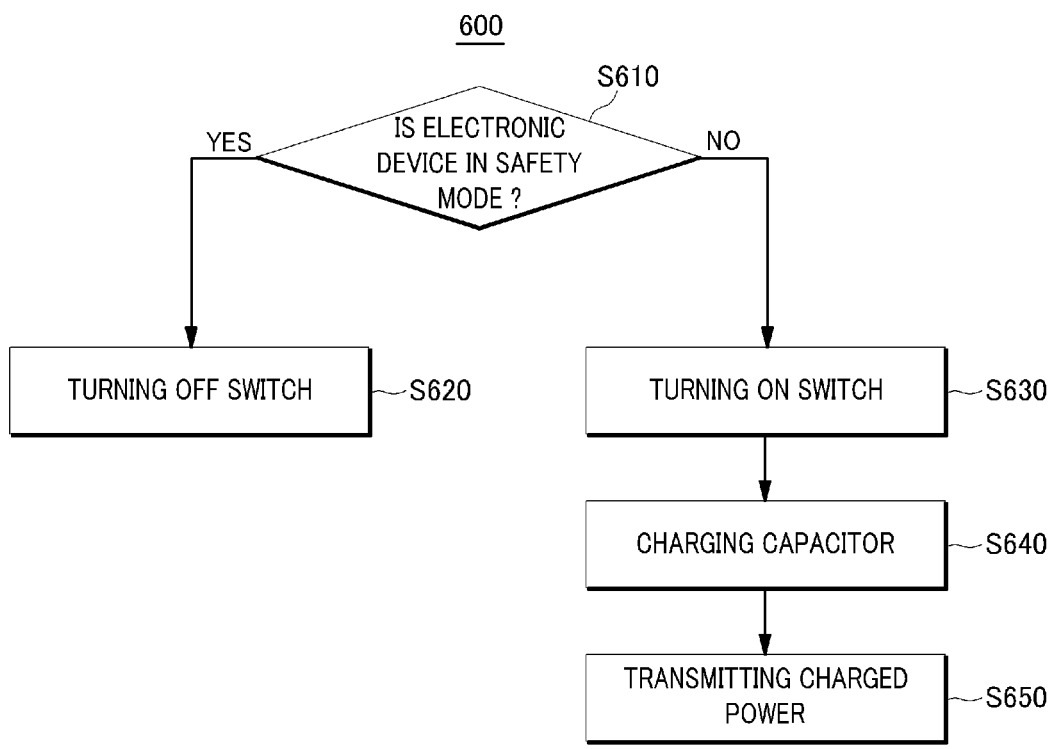
FIG. 6 illustrates an example flow diagram of a method adapted to selectively charge a capacitor coupled to a memory.

FIG. 6 illustrates an example flow diagram of a method adapted to selectively charge a capacitor coupled to a memory, arranged in accordance with at least some embodiments described herein. An example method 600 in FIG. 6 may be implemented using, for example, a computing device including a processor adapted to selectively charge a capacitor coupled to a memory.

Method 600 may include one or more operations, actions, or functions as illustrated by one or more of blocks S610, S620, S630, S640 and/or S650. Although illustrated as discrete blocks, various blocks may be divided into additional blocks, combined into fewer blocks, supplemented with other blocks, or eliminated, depending on the particular implementation. In some further examples, the various described blocks may be implemented as a parallel process instead of a sequential process, or as a combination thereof. For the sake of simplicity of explanation, method 600 will be described by way of example with respect to device 100. Method 600 may be adapted to the operation of any of the other electronic devices described herein. Method 600 may begin at block S610, "IS ELECTRONIC DEVICE IN SAFETY MODE?"

At block S610, in some embodiments, switch controller 140 illustrated in FIG. 1 may determine whether electronic device 100 is in a safety mode or in a normal mode. In some embodiments, switch controller 140 may determine that electronic device 100 is in the safety mode, for example, when a user input to request for the safety mode is received or when an application that requires private information is hosted (or executed) on electronic device 100. If it is determined in block S610 that electronic device 100 is in the safety mode, electronic device 100 may proceed to perform block S620 "TURNING OFF SWITCH" and/or next operations as explained below. Otherwise, if it is determined in block S610 that electronic device 100 is not in the safety mode (e.g., electronic device 100 is in a normal mode), electronic device 100 may proceed to perform block S630 "TURNING ON SWITCH" and/or next operations as explained below.

At block S620, switch controller 140 may turn off switch 120 that is installed between power supply 110 and capacitor 130 that is coupled to at least one of memory 160 that includes volatile memory 161 and non-volatile memory 162. Thus, capacitor 130 may not receive power from power supply 110 and may not accumulate power therein. Further, data backup or data transmission from volatile memory 161 to non-volatile memory 162 may not occur, when power supply 110 stops the supply of the power.

At block S630, switch controller 140 may turn on switch 120, so that switch 120 couples power supply 110 with capacitor 130. Block S630 may be followed by block S640, "CHARGING CAPACITOR."

At block S640, power supply 110 may supply power to capacitor 130. Further, capacitor 130 may be charged with the power supplied from power supply 110. Thus, the power may be accumulated in capacitor 130. Block S640 may be followed by block S650, "TRANSMITTING CHARGED POWER."

At block S650, capacitor 130 may transmit the power, which is charged in capacitor 130 at block S640, to at least one of memory 160 or processor 170, after power supply 110 stops the supply of the power (or power supply 110 reduces the power). So, data that is stored in volatile memory 161 may be transmitted to non-volatile memory 162 with the power supplied from capacitor 130. Thus, the data that has been stored in volatile memory 161 may be securely backed up to non-volatile memory 162, even when the power is abruptly cut off. A power source to supply power to at least one of memory 160 or processor 170 may be altered from power supply 110 to capacitor 130.

In light of the present disclosure, for this and other methods disclosed herein, the functions and operations performed in the methods may be implemented in differing order. Furthermore, the outlined operations are only provided as examples, and some of the operations may be optional, combined into fewer operations, supplemented with other operations, or expanded into additional operations without detracting from the essence of the disclosed embodiments.

Figure 7:
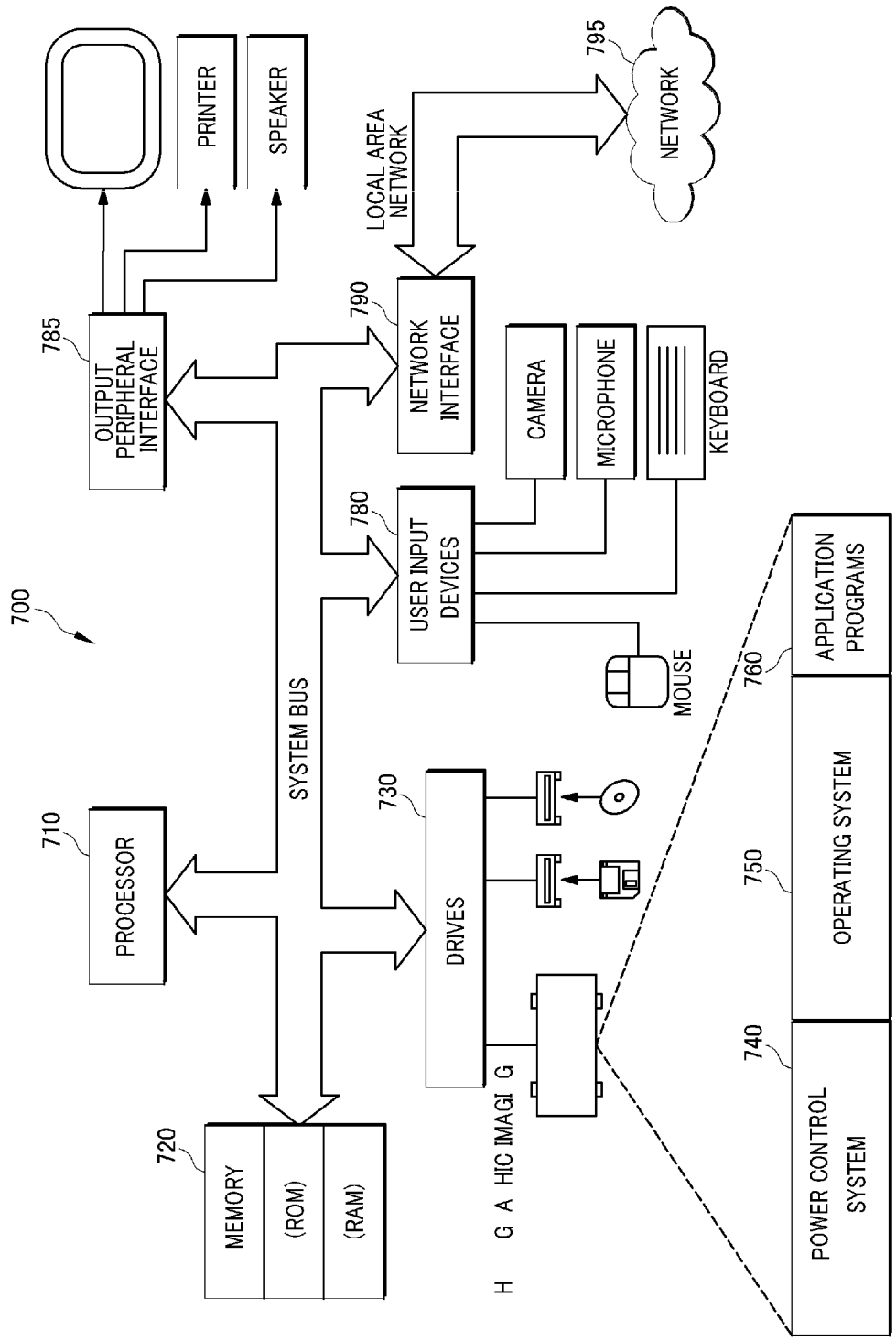
FIG. 7 shows a block diagram of an example computing system that can be configured to implement methods to selectively charge a capacitor coupled to a memory.

FIG. 7 shows a block diagram of an example computing system that can be configured to implement methods to selectively charge a capacitor coupled to a memory, arranged in accordance with at least some embodiments described herein. As depicted in FIG. 7, a computer 700 may include a processor 710, a memory 720 and one or more drives 730. Processor 710 and memory 720 may be used to implement the processor(s) and memory/memories previously described above. Computer 700 may be implemented as a computer system, an embedded control computer, a laptop, or a server computer, a mobile device, a set-top box, a kiosk, a vehicular information system, a mobile telephone, a customized machine, or other hardware platform.

Drives 730 and their associated computer storage media may provide storage of computer readable instructions, data structures, program modules and other data for computer 1000. Drives 730 may include a power control system 740, an operating system (OS) 750, and application programs 760. Power control system 740 may be adapted to selectively charge a capacitor coupled to a memory in such a manner as described above with respect to FIGS. 1 to 6. In some embodiments, the switch controller(s), capacitor(s), and/or switch(es) previously described above may be implemented in power control system 740.

Computer 700 may further include user input devices 780 through which a user may enter commands and data. Input devices can include an electronic digitizer, a camera, a microphone, a keyboard and pointing device, commonly referred to as a mouse, trackball or touch pad. Other input devices may include a joystick, game pad, satellite dish, scanner, or the like.

These and other input devices can be coupled to processor 710 through a user input interface that is coupled to a system bus, but may be coupled by other interface and bus structures, such as a parallel port, game port or a universal serial bus (USB). Computers such as computer 700 may also include other peripheral output devices such as display devices, which may be coupled through an output peripheral interface 785 or the like.

Computer 700 may operate in a networked environment using logical connections to one or more computers, such as a remote computer coupled to a network interface 790. The remote computer may be a personal computer, a server, a router, a network PC, a peer device or other common network node, and can include many or all of the elements described above relative to computer 700.

Networking environments are commonplace in offices, enterprise-wide area networks (WANs), local area networks (LANs), intranets, and the Internet. When used in a LAN or WLAN networking environment, computer 700 may be coupled to the LAN through network interface 790 or an adapter. When used in a WAN networking environment, computer 700 typically includes a modem or other device for establishing communications over the WAN, such as the Internet or a network 795. The WAN may include the Internet, the illustrated network 795, various other networks, or any combination thereof. Other mechanisms of establishing a communications link, ring, mesh, bus, cloud, or network between the computers may be used.

In some embodiments, computer 700 may be coupled to a networking environment. Computer 700 may include one or more instances of a physical computer-readable storage medium or media associated with drives 730 or other storage devices. The system bus may enable processor 710 to read code and/or data to/from the computer-readable storage media. The media may represent an apparatus in the form of storage elements that are implemented using any suitable technology, including but not limited to semiconductors, magnetic materials, optical media, electrical storage, electrochemical storage, or any other such storage technology. The media may represent components associated with memory 720, whether characterized as RAM, ROM, flash, or other types of volatile or nonvolatile memory technology.

The media may also represent secondary storage, whether implemented as storage drives 730 or otherwise. Hard drive implementations may be characterized as solid state, or may include rotating media storing magnetically encoded information.

Processor 710 may be constructed from any number of transistors or other circuit elements, which may individually or collectively assume any number of states. More specifically, processor 710 may operate as a state machine or finite-state machine. Such a machine may be transformed to a second machine, or specific machine by loading executable instructions. These computer-executable instructions may transform processor 710 by specifying how processor 710 transitions between states, thereby transforming the transistors or other circuit elements constituting processor 710 from a first machine to a second machine. The states of either machine may also be transformed by receiving input from user input devices 780, network interface 790, other peripherals, other interfaces, or one or more users or other actors. Either machine may also transform states, or various physical characteristics of various output devices such as printers, speakers, video displays, or otherwise.

Figure 8:
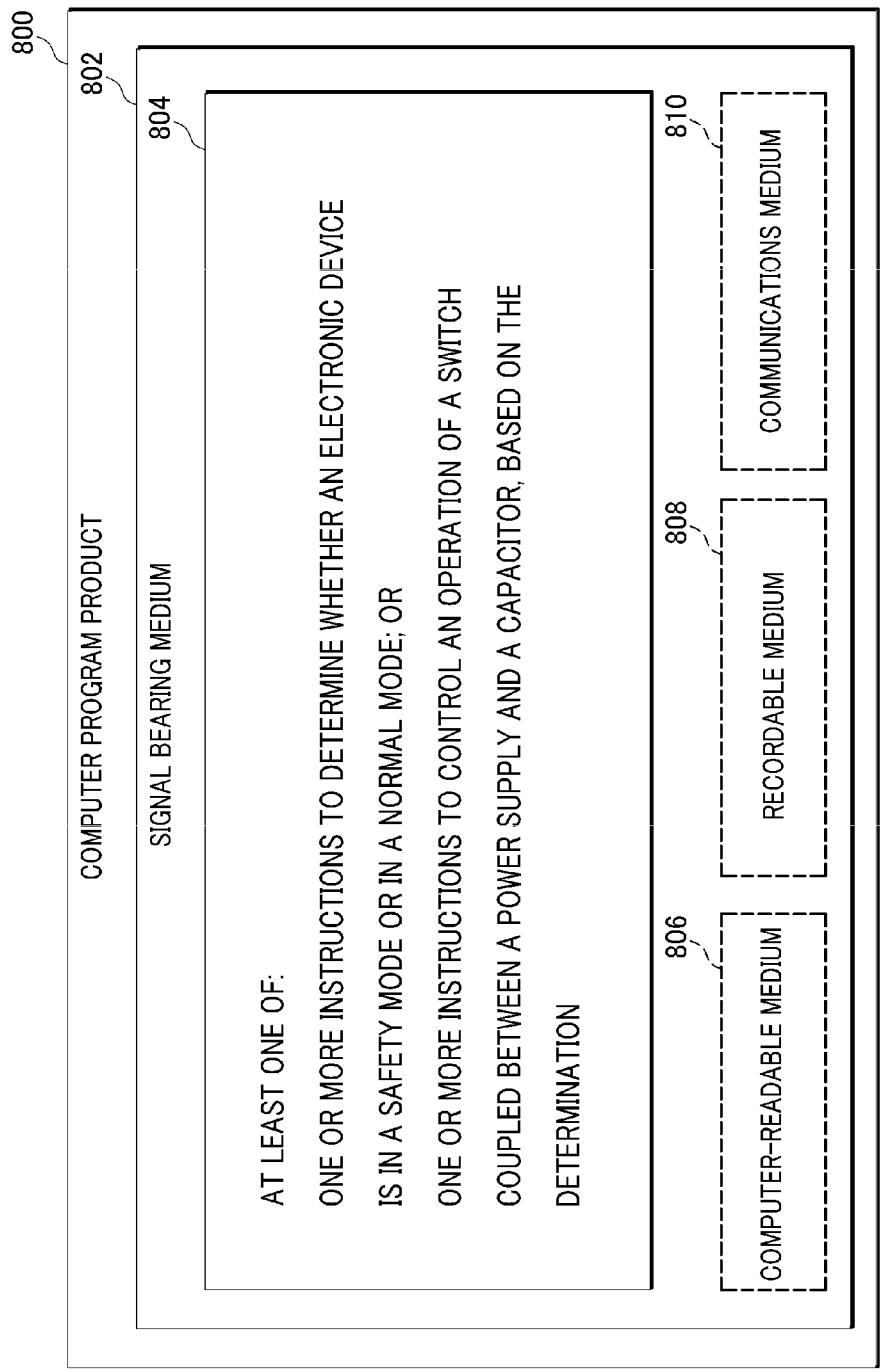
FIG. 8 illustrates a computer program product that can be utilized to selectively charge a capacitor coupled to a memory, all arranged in accordance with at least some embodiments described herein.

FIG. 8 illustrates a computer program product that can be utilized to selectively charge a capacitor coupled to a memory, arranged in accordance with at least some embodiments described herein. Program product 800 may include a signal bearing medium 802. Signal bearing medium 802 may include one or more instructions 804 that, in response to execution by, for example, a processor, may provide the functionality and features described above with respect to FIGS. 1 to 7. By way of example, instructions 804 may include at least one of: one or more instructions to determine whether an electronic device is in a safety mode or in a normal mode; or one or more instructions to control an operation of a switch coupled between a power supply and a capacitor, based on the determination. Thus, for example, referring to FIGS. 1 to 5, electronic device 100, 200, 300, 400 or 500 may undertake one or more of the blocks shown in FIG. 5 in response to instructions 804.

In some implementations, signal bearing medium 802 may encompass a non-transitory computer-readable medium 806, such as, but not limited to, a hard disk drive, a Compact Disc (CD), a Digital Video Disk (DVD), a digital tape, memory, etc. In some implementations, signal bearing medium 802 may encompass a recordable medium 808, such as, but not limited to, memory, read/write (R/W) CDs, R/W DVDs, etc. In some implementations, signal bearing medium 802 may encompass a communications medium 810, such as, but not limited to, a digital and/or an analog communication medium (e.g., a fiber optic cable, a waveguide, a wired communications link, a wireless communication link, etc.). Thus, for example, program product 800 may be conveyed to one or more modules of electronic device 100, 200, 300, 400 or 500 by an RF signal bearing medium 802, where the signal bearing medium 802 is conveyed by a wireless communications medium 810 (e.g., a wireless communications medium conforming with the IEEE 802.11 standard).

The present disclosure is not to be limited in terms of the particular embodiments described in this application, which are intended as illustrations of various aspects. Many modifications and variations may be made without departing from its spirit and scope. Functionally equivalent methods and apparatuses within the scope of the disclosure, in addition to those enumerated herein, are possible from the foregoing descriptions. Such modifications and variations are intended to fall within the scope of the appended claims. The present disclosure is to be limited only by the terms of the appended claims, along with the full scope of equivalents to which such claims are entitled. This disclosure is not limited to particular methods, reagents, compounds, compositions or biological systems, which can, of course, vary. The terminology used herein is for the purpose of describing particular embodiments only, and is not intended to be limiting.

The herein described subject matter sometimes illustrates different components contained within, or connected with, different other components. Such depicted architectures are merely examples, and in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member.

From the foregoing, various embodiments of the present disclosure have been described herein for purposes of illustration, and various modifications may be made without departing from the scope and spirit of the present disclosure. Accordingly, the various embodiments disclosed herein are not intended to be limiting, with the true scope and spirit being indicated by the following claims.

What is claimed is:

1. An electronic device, comprising:
   a memory device that includes a volatile memory and a non-volatile memory;
   a capacitor coupled to the memory device;
   a power supply configured to supply power at least to the capacitor;
   a switch coupled between the power supply and the capacitor; and
   a switch controller coupled to the switch and configured to:
   determine whether the electronic device is in a safety mode or in a normal mode, wherein the safety mode corresponds to a mode of operation in which the electronic device processes private data and stores the private data in the volatile memory; and
   control an operation of the switch, in response to determination that the electronic device is in the safety mode, to prevent the power from being supplied from the power supply to the capacitor during the safety mode, such that before and during a power loss condition of the electronic device, the capacitor has insufficient charge to enable transfer of the private data from the volatile memory to the non-volatile memory.

2. The electronic device of claim 1, wherein in response to determination that the electronic device is in the safety mode, the switch controller controls the operation of the switch to turn off the switch, so as to decouple the power supply from the capacitor.

3. The electronic device of claim 2, further comprising:
a receiver unit coupled to the switch controller and configured to receive a request for the safety mode,
wherein the switch controller is configured to determine that the electronic device is in the safety mode, based on the received request for the safety mode.

4. The electronic device of claim 2, further comprising:
an application management unit coupled to the switch controller and configured to host an application on the electronic device,
wherein the switch controller is configured to determine that the electronic device is in the safety mode, based on the hosted application.

5. The electronic device of claim 1, wherein in response to determination that the electronic device is in the normal mode, the switch controller is configured to turn on the switch, so as to charge the capacitor with the power supplied from the power supply.

6. The electronic device of claim 1, further comprising:
a processor configured to control a data transmission from the volatile memory to the non-volatile memory while in the normal mode.

7. The electronic device of claim 6, wherein in response to determination that the electronic device is in the normal mode, the switch controller is configured to turn on the switch, so as to charge the capacitor with the power supplied from the power supply.

8. The electronic device of claim 7, wherein the capacitor is configured to transmit charge to at least one of the volatile memory or non-volatile memory, in response to a loss of power from the power supply.

9. The electronic device of claim 6, wherein in response to determination that the electronic device is in the safety mode, the switch controller is configured to turn off the switch, and to transmit, to the processor, a signal that indicates that the switch is turned off.

10. A method performed under control of an electronic device including a memory device that includes a volatile memory and a non-volatile memory, a capacitor coupled to the memory device, a power supply configured to supply power at least to the capacitor, and a switch coupled between the power supply and the capacitor, the method comprising:
determining, by a switch controller coupled to the switch, whether the electronic device is in a safety mode or in a normal mode, wherein the safety mode corresponds to a mode of operation in which the electronic device processes private data and stores the private data in the volatile memory; and
in response to determining that the electronic device is in the safety mode, controlling, by the switch controller, an operation of the switch to prevent the power from being supplied from the power supply to the capacitor during the safety mode, such that before and during a power loss condition of the electronic device, the capacitor has insufficient charge to enable transfer of the private data from the volatile memory to the non-volatile memory.

11. The method of claim 10, wherein the controlling includes turning off the switch by the switch controller, in response to determination that the electronic device is in the safety mode, so as to decouple the power supply from the capacitor so that the power is not supplied to the capacitor by the power supply.

12. The method of claim 11, further comprising:
receiving, by a receiver unit, a request for the safety mode,
wherein the determining includes determining, by the switch controller, that the electronic device is in the safety mode, based on the received request for the safety mode.

13. The method of claim 11, wherein the determining includes determining, by the switch controller, that the electronic device is in the safety mode, based on an application that is hosted, by an application management unit, on the electronic device.

14. The method of claim 10, further comprising:
controlling, by a processor, a data transmission from the volatile memory included in the memory device to the non-volatile memory included in the memory device.

15. The method of claim 10, wherein the controlling the operation of the switch includes turning off the switch by the switch controller, in response to determining that the electronic device is in the safety mode, and wherein the method further comprises:
transmitting to the processor, by the switch controller, a signal that indicates that the switch is turned off.

16. The method of claim 10, further comprising turning on the switch, by the switch controller, in response to determining that the electronic device is in the normal mode such that the capacitor is charged during the normal mode by the power supplied from the power supply.

17. The method of claim 16, further comprising:
charging the capacitor with the power supplied from the power supply, after the switch is turned on.

18. The method of claim 17, further comprising:
transmitting, by the capacitor, charge to at least one of the volatile memory included in the memory device and or the non-volatile memory included in the memory device, in response to a loss of power from the power supply.

19. An electronic device, comprising:
a memory device that includes a volatile memory and a non-volatile memory;
a capacitor coupled to the memory device;
a switch that couples a power supply and the capacitor; and
a switch controller coupled to the switch and operable to perform operations comprising:
determining whether the electronic device is in a safety mode; and
in response to determining that the electronic device is in the safety mode, controlling the switch, to prevent the capacitor from being charged by the power supply during the safety mode, such that during a power loss condition in the electronic device, the capacitor has insufficient charge to enable transfer of data from the volatile memory to the non-volatile memory.

* * * * *